(12) United States Patent
Chen et al.

(10) Patent No.: US 12,453,167 B2
(45) Date of Patent: Oct. 21, 2025

(54) SILICON CARBIDE METAL OXIDE SEMICONDUCTOR FIELD EFFECT TRANSISTOR AND MANUFACTURING METHOD OF SILICON CARBIDE METAL OXIDE SEMICONDUCTOR FIELD EFFECT TRANSISTOR

(71) Applicants: GREE ELECTRIC APPLIANCES, INC.OF ZHUHAI, Zhuhai (CN); EDGELESS SEMICONDUCTOR CO. LTD. OF ZHUHAI, Zhuhai (CN)

(72) Inventors: Daokun Chen, Zhuhai (CN); Bo Shi, Zhuhai (CN); Yiren Lin, Zhuhai (CN); Dan Zeng, Zhuhai (CN)

(73) Assignees: GREE ELECTRIC APPLIANCES, INC. OF ZHUHAI, Guangdong (CN); EDGELESS SEMICONDUCTOR CO. LTD. OF ZHUHAI, Guangdong (CN)

(*) Notice: Subject to any disclaimer, the term of this patent is extended or adjusted under 35 U.S.C. 154(b) by 360 days.

(21) Appl. No.: 18/248,002

(22) PCT Filed: Jul. 30, 2021

(86) PCT No.: PCT/CN2021/109845
§ 371 (c)(1),
(2) Date: Apr. 5, 2023

(87) PCT Pub. No.: WO2022/083216
PCT Pub. Date: Apr. 28, 2022

(65) Prior Publication Data
US 2023/0378341 A1 Nov. 23, 2023

(30) Foreign Application Priority Data
Oct. 19, 2020 (CN) .......................... 202011120756.1

(51) Int. Cl.
*H10D 84/00* (2025.01)
*H10D 12/01* (2025.01)
(Continued)

(52) U.S. Cl.
CPC ......... *H10D 84/146* (2025.01); *H10D 12/031* (2025.01); *H10D 62/127* (2025.01); *H10D 62/8325* (2025.01)

(58) Field of Classification Search
CPC .. H10D 84/146; H10D 12/031; H10D 62/127; H10D 62/8325; H10D 64/519;
(Continued)

(56) References Cited

U.S. PATENT DOCUMENTS

| 10,483,389 B2 | 11/2019 | Yen et al. |
| 2010/0224886 A1 | 9/2010 | Iwamuro |

(Continued)

FOREIGN PATENT DOCUMENTS

| CN | 101345243 A | 1/2009 |
| CN | 101641763 A | 2/2010 |

(Continued)

OTHER PUBLICATIONS

International Search Report for Corresponding International App. No. PCT/CN2021/109845, mailed Oct. 29, 2021, 2 pages.
(Continued)

*Primary Examiner* — Mohammad A Rahman
(74) *Attorney, Agent, or Firm* — Armstrong Teasdale LLP

(57) ABSTRACT

Some embodiments of the present disclosure provide a silicon carbide metal oxide semiconductor field effect transistor and a manufacturing method. The transistor includes first and second cells which jointly include a drain electrode layer, an ohmic contact layer, a substrate layer, an epitaxial layer, an interlayer dielectric layer, and a source electrode layer, the first cell further includes a first deep well region,
(Continued)

a second deep well region, a first shallow well region, a second shallow well region, a two first source region, a two second source region, a first gate oxide layer, and a first polysilicon gate, and the second cell further includes a third deep well region, a fourth deep well region, a third shallow well region, a fourth shallow well region, a second gate oxide layer, a third gate oxide layer, a second polysilicon gate, and a third polysilicon gate.

20 Claims, 2 Drawing Sheets

(51) Int. Cl.
*H10D 62/10* (2025.01)
*H10D 62/832* (2025.01)

(58) Field of Classification Search
CPC ...... H10D 62/10; H10D 30/021; H10D 30/60; H10D 62/124
See application file for complete search history.

(56) References Cited

U.S. PATENT DOCUMENTS

| | | | |
|---|---|---|---|
| 2016/0079411 A1 | 3/2016 | Hino et al. | |
| 2016/0141369 A1 | 5/2016 | Kim et al. | |

FOREIGN PATENT DOCUMENTS

| | | | |
|---|---|---|---|
| CN | 101840933 A | | 9/2010 |
| CN | 102468299 A | | 5/2012 |
| CN | 105304708 A | | 2/2016 |
| CN | 106170853 A | | 11/2016 |
| CN | 106783851 A | * | 5/2017 |
| CN | 213752715 U | | 7/2021 |

OTHER PUBLICATIONS

Supplementary European Search Report for corresponding EP Application No. 21881636 dated Aug. 30, 2024.
Chinese Search Report for corresponding CN Application 2020111207561 dated Nov. 18, 2024.

* cited by examiner

SILICON CARBIDE METAL OXIDE SEMICONDUCTOR FIELD EFFECT TRANSISTOR AND MANUFACTURING METHOD OF SILICON CARBIDE METAL OXIDE SEMICONDUCTOR FIELD EFFECT TRANSISTOR

CROSS-REFERENCE TO RELATED APPLICATION

The present application is a National Stage Entry of International App. No. PCT/CN2021/109845, filed Jul. 30, 2021, entitled "Silicon Carbide Metal Oxide Semiconductor Field Effect Transistor and Manufacturing Method Therefor," which claims priority to Chinese Patent Application No. 202011120756.1 filed to the China National Intellectual Property Administration on Oct. 19, 2020 and entitled "Silicon Carbide Metal Oxide Semiconductor Field Effect Transistor and Manufacturing Method of Silicon Carbide Metal Oxide Semiconductor Field Effect Transistor," the entire contents of which are hereby incorporated by reference in their entirety.

TECHNICAL FIELD

The disclosure relates to a field of semiconductor device manufacturing, and in particular to a silicon carbide metal oxide semiconductor field effect transistor and a manufacturing method of silicon carbide metal oxide semiconductor field effect transistor.

BACKGROUND

Power electronics technology has become one of the important supporting technologies in modern industrial society, and a silicon carbide metal oxide semiconductor field effect transistor (also called SiC MOSFET) is widely used in various fields including electric vehicles, photovoltaic inversion, rail transit, wind power generation, and motor driving due to characteristics of high operating frequency, low switching loss, high power density, and capability of realizing miniaturization of passive devices and heat dissipation parts. Even so, the silicon carbide metal oxide semiconductor field effect transistor known to inventors has defects, such as high short-circuit current density, low short-circuit tolerance, short short-circuit time, high forward voltage drop of a body diode, and the like, so that better improvement is needed.

SUMMARY

In order to solve all or part of the above problems, an objective of the disclosure is to provide a silicon carbide metal oxide semiconductor field effect transistor and a manufacturing method of Silicon Carbide Metal Oxide Semiconductor Field Effect Transistor, to solve problems of high short-circuit current density, low short-circuit tolerance, short short-circuit time, and high forward voltage drop of a body diode in the art known to inventors, which can not only ensure that the silicon carbide metal oxide semiconductor field effect transistor has the advantages of low short-circuit current density, high short-circuit tolerance, long short-circuit time, and the like, but also can reduce the reverse leakage current of a Schottky diode while reducing the forward voltage drop of a body diode.

In some embodiments, a silicon carbide metal oxide semiconductor field effect transistor is provided, which includes a first cell and a second cell that are disposed alternately, and the first cell and the second cell jointly include a drain electrode layer, an ohmic contact layer, a substrate layer, an epitaxial layer, an interlayer dielectric layer, and a source electrode layer which are disposed in a stacking mode. The first cell further includes: a first deep well region and a second deep well region which are formed in the epitaxial layer and connected with the interlayer dielectric layer; a first shallow well region and a second shallow well region which are formed in the first deep well region and the second deep well region, respectively; two first source region and two second source region which are formed in the first deep well region and the second deep well region, respectively, the two first source region are symmetric relative to the first shallow well region and are connected with the first shallow well region; the two second source region are symmetric relative to the second shallow well region and are connected with the second shallow well region; a first gate oxide layer, which is formed in the interlayer dielectric layer and connected with the epitaxial layer, the first deep well region and the second deep well region; and a first polysilicon gate, which is also formed in the interlayer dielectric layer and covers the first gate oxide layer. The second cell includes: a third deep well region, and a fourth deep well region which are formed in the epitaxial layer and connected with the interlayer dielectric layer; a third shallow well region and a fourth shallow well region which are formed in the third deep well region and the fourth deep well region respectively; a second gate oxide layer and a third gate oxide layer which are formed in the interlayer dielectric layer and cover the third deep well region and the fourth deep well region respectively; and a second polysilicon gate and a third polysilicon gate which are formed in the interlayer dielectric layer and cover the second gate oxide layer and the third gate oxide layer respectively. The source electrode layer includes a first settling part in ohmic contact with the first shallow well region and the two first source region, a second settling part in ohmic contact with the second shallow well region and the two second source region, a third settling part in ohmic contact with the third shallow well region, a fourth settling part in Schottky contact with the third deep well region, the fourth deep well region and the epitaxial layer, and a fifth settling part in ohmic contact with the fourth shallow well region, and an interval between the third deep well region and the fourth deep well region is smaller than an interval between the first deep well region and the second deep well region.

In some embodiments, the interval between the third deep well region and the fourth deep well region is 1.0-3.0 µm.

In some embodiments, an ohmic contact between the first settling part and the first shallow well region, an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all formed by aluminum and titanium, and thicknesses of the ohmic contact between the first settling part and the first shallow well region, the ohmic contact between the first settling part and the two first source region, the ohmic contact between the second settling part and the second shallow well region, the ohmic contact between the second settling part and the two second source region, the ohmic contact between the third settling part and the third shallow well region, the ohmic contact between the fifth settling part and the fourth shallow well region are all 10-500 nm.

In some embodiments, an ohmic contact between the first settling part and the first shallow well region, an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all formed by aluminum and nickel, and thicknesses of the ohmic contact between the first settling part and the first shallow well region, the ohmic contact between the first settling part and the two first source region, the ohmic contact between the second settling part and the second shallow well region, the ohmic contact between the second settling part and the two second source region, the ohmic contact between the third settling part and the third shallow well region, the ohmic contact between the fifth settling part and the fourth shallow well region are all 10-500 nm.

In some embodiments, an ohmic contact between the first settling part and the first shallow well region, an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all formed by aluminum, titanium and nickel, and thicknesses of the ohmic contact between the first settling part and the first shallow well region, the ohmic contact between the first settling part and the two first source region, the ohmic contact between the second settling part and the second shallow well region, the ohmic contact between the second settling part and the two second source region, the ohmic contact between the third settling part and the third shallow well region, the ohmic contact between the fifth settling part and the fourth shallow well region are all 10-500 nm.

In some embodiments, a Schottky contact between the fourth settling part and the third deep well region, a Schottky contact between the fourth settling part and the fourth deep well region, a Schottky contact between the fourth settling part and the epitaxial layer are all formed by titanium, molybdenum, tungsten and nickel, and thicknesses of the Schottky contact between the fourth settling part and the third deep well region, the Schottky contact between the fourth settling part and the fourth deep well region, the Schottky contact between the fourth settling part and the epitaxial layer are all 10-500 nm.

In some embodiments, a Schottky contact between the fourth settling part and the third deep well region, a Schottky contact between the fourth settling part and the fourth deep well region, a Schottky contact between the fourth settling part and the epitaxial layer are all formed by titanium, molybdenum, tungsten and platinum, and thicknesses of the Schottky contact between the fourth settling part and the third deep well region, the Schottky contact between the fourth settling part and the fourth deep well region, the Schottky contact between the fourth settling part and the epitaxial layer are all 10-500 nm.

In some embodiments, a Schottky contact between the fourth settling part and the third deep well region, a Schottky contact between the fourth settling part and the fourth deep well region, a Schottky contact between the fourth settling part and the epitaxial layer are all formed by titanium, molybdenum, tungsten, nickel and platinum, and thicknesses of the Schottky contact between the fourth settling part and the third deep well region, the Schottky contact between the fourth settling part and the fourth deep well region, the Schottky contact between the fourth settling part and the epitaxial layer are all 10-500 nm.

In some embodiments, the substrate layer, the epitaxial layer, the two first source region and the two second source region are all formed by an N-type silicon carbide semiconductor material, and the first deep well region, the second deep well region, the third deep well region and the fourth deep well region as well as the first shallow well region, the second shallow well region, the third shallow well region and the fourth shallow well region are all formed by a P-type silicon carbide semiconductor material.

In some embodiments, semiconductor doping concentrations in the first deep well region, the second deep well region, the third deep well region and the fourth deep well region are all 5e16-5e18 $cm^{-3}$, and thicknesses of the first deep well region, the second deep well region, the third deep well region and the fourth deep well region are all 0.5-3.0 μm; semiconductor doping concentrations in the first shallow well region, the second shallow well region, the third shallow well region and the fourth shallow well region are all 1e18-1e19 $cm^{-3}$, and thicknesses of the first shallow well region, the second shallow well region, the third shallow well region and the fourth shallow well region are all 0.5-1.5 μm; and semiconductor doping concentrations in the two first source region and the two second source region are all 5e18-2e19 $cm^{-3}$, and thicknesses of the two first source region and the two second source region are all 0.2-0.5 μm.

In some embodiments, a thickness of the substrate layer is 100-180 μm, and a resistivity of the substrate layer is 0.01-0.03 Ωcm; and a thickness of the epitaxial layer is 5-100 μm, and a doping concentration of the epitaxial layer is 1e14 to 5e16 $cm^{-3}$.

In some embodiments, a material of the interlayer dielectric layer is one or any combination of silicon dioxide, silicon nitride, silicon oxynitride, borophosphosilicate glass and borosilicate glass, and a thickness of the interlayer dielectric layer is 0.5-2 μm.

In some embodiments, materials of the source electrode layer and the drain electrode layer are all aluminum, titanium and nickel, a thickness of a flat part, for connecting the first settling part, the second settling part, the third settling part, the fourth settling part and the fifth settling part, of the source electrode layer is 2-5 μm, and a thickness of the drain electrode layer is 0.5-4 μm.

In some embodiments, materials of the source electrode layer and the drain electrode layer are all aluminum, titanium and silver, a thickness of a flat part, for connecting the first settling part, the second settling part, the third settling part, the fourth settling part and the fifth settling part, of the source electrode layer is 2-5 μm, and a thickness of the drain electrode layer is 0.5-4 μm.

In some embodiments, materials of the source electrode layer and the drain electrode layer are all aluminum, titanium, nickel and silver, a thickness of a flat part, for connecting the first settling part, the second settling part, the third settling part, the fourth settling part and the fifth settling part, of the source electrode layer is 2-5 μm, and a thickness of the drain electrode layer is 0.5-4 μm.

In some embodiments, a manufacturing method for a silicon carbide metal oxide semiconductor field effect transistor, which is the silicon carbide metal oxide semiconductor field effect transistor mentioned above is provided. The manufacturing method includes the following steps: S1, a substrate is prepared, and an epitaxial layer is prepared on the substrate; S2, a first deep well region, a second deep well region, a third deep well region and a fourth deep well region are prepared on the epitaxial layer; S3, two first source region and two second source region are prepared in the first deep well region and the second deep well region, respectively; S4, a first shallow well region, a second shallow well region, a third shallow well region and a fourth shallow well region are prepared in the first deep well region, the second deep well region, the third deep well region and the fourth deep well region, respectively; S5, a first gate oxide layer, a second gate oxide layer and a third gate oxide layer, as well as a first polysilicon gate, a second polysilicon gate and a third polysilicon gate sequentially covering the first gate oxide layer, the second gate oxide layer and the third gate oxide layer are prepared on the epitaxial layer; S6, an interlayer dielectric layer which is configured for burying the first gate oxide layer, the second gate oxide layer and the third gate oxide layer and the first polysilicon gate, the second polysilicon gate and the third polysilicon gate is prepared on the epitaxial layer; S7, a source electrode layer is prepared on the interlayer dielectric layer and enabled to be in ohmic contact with the first shallow well region, the second shallow well region, the third shallow well region, the fourth shallow well region, the two first source region and the two second source region, and be in Schottky contact with the third deep well region, the fourth deep well region and the epitaxial layer; S8, the substrate is thinned to form a substrate layer; S9, an ohmic contact layer is prepared on the substrate layer; and S10, a drain electrode layer is prepared on the ohmic contact layer.

According to the silicon carbide metal oxide semiconductor field effect transistor (also called transistor) and the manufacturing method provided by the disclosure, source region included in the second cell are saved, which is equivalent to that continuous source regions in the art known to inventors are improved into discontinuous source regions, so that the channel density of the silicon carbide metal oxide semiconductor field effect transistor can be reduced without changing its size, meanwhile, the short-circuit current density is reduced, the short-circuit tolerance is improved, and the effect of prolonging the short-circuit time is archived. In the transistor, Schottky contact is formed on the epitaxial layer between the third deep well region and the fourth deep well region, meanwhile, the interval between the third deep well region and the fourth deep well region with Schottky contact is smaller than the interval between the first deep well region and the second deep well region without Schottky contact, which is equivalent to integrating a Schottky diode on the basis of the art known to inventors, and the shielding effect of the third deep well region and the fourth deep well region on the electric field at the Schottky contact under reverse bias conditions is enhanced, which can reduce the reverse leakage current of a Schottky diode while reducing the forward voltage drop of a body diode. Therefore, with the silicon carbide metal oxide semiconductor field effect transistor and the manufacturing method therefor, the problems of high short-circuit current density, low short-circuit tolerance, short short-circuit time, and high forward voltage drop of a body diode, are solved, and meanwhile, the transistor is simple in structure, easy to assemble, safe and reliable to use, and convenient to implement for applications.

BRIEF DESCRIPTION OF THE DRAWINGS

The drawings forming a part of the disclosure in the specification are adopted to provide a further understanding to the disclosure. Schematic embodiments of the disclosure and descriptions thereof are adopted to explain the disclosure and not intended to form improper limits to the disclosure. In the drawings.

In the drawings, like reference numerals are used for like parts. The drawings are not drawn to actual scale.

DETAILED DESCRIPTION OF THE EMBODIMENTS

It is to be noted that the embodiments and features in the embodiments of the disclosure are combined with each other without conflict. The disclosure will be described in detail below with reference to the accompanying drawings and the embodiments.

Figure 1:
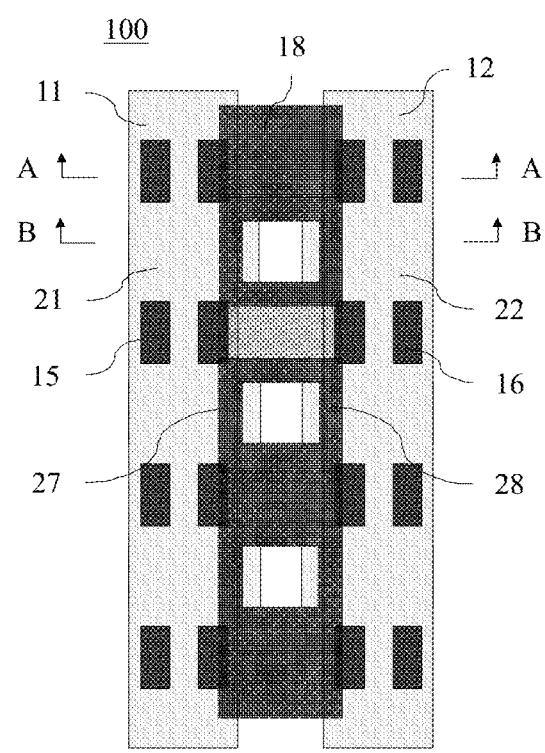
FIG. 1 illustrates a partial schematic structure diagram of a silicon carbide metal oxide semiconductor field effect transistor according to some embodiments of the present disclosure.
Figure 2:
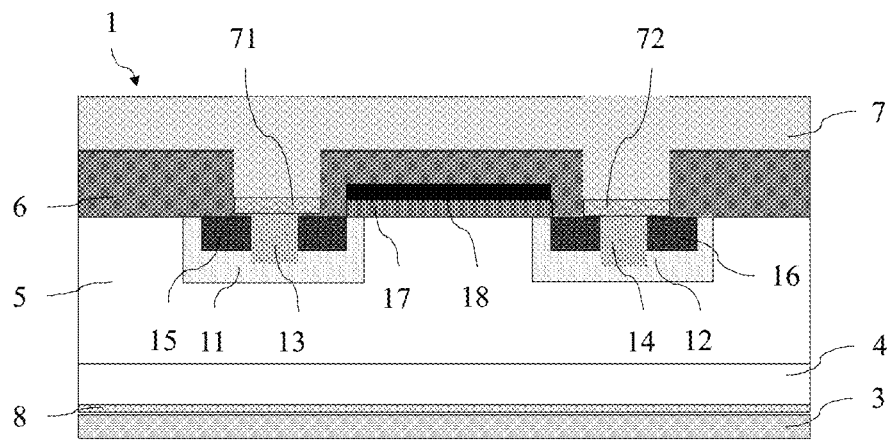
FIG. 2 illustrates a first cell at the position of line A-A in FIG. 1.
Figure 3:
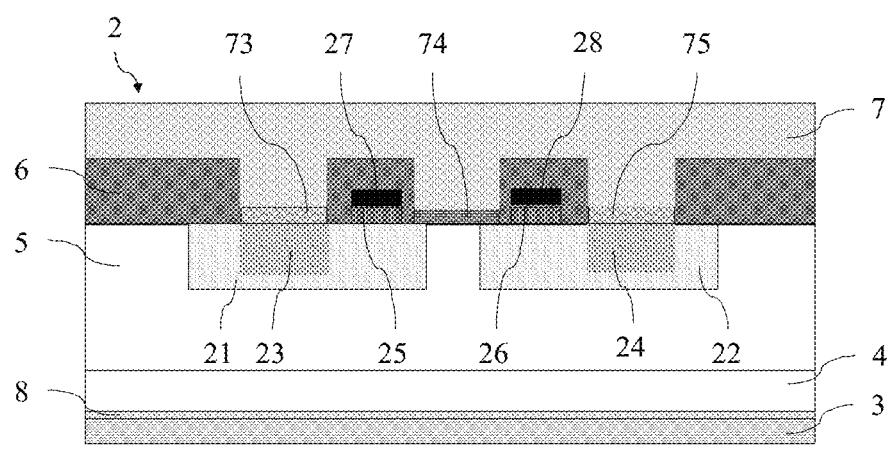
FIG. 3 illustrates a second cell at the position of line B-B in FIG. 1.

As shown in FIGS. 1-3, a silicon carbide metal oxide semiconductor field effect transistor 100 provided by the disclosure includes a first cell 1 and a second cell 2 which are disposed alternately, and the first cell 1 and the second cell 2 jointly include a drain electrode layer 3, an ohmic contact layer 8, a substrate layer 4, an epitaxial layer 5, an interlayer dielectric layer 6, and a source electrode layer 7 which are disposed in a stacking mode. As shown in FIG. 2, the first cell 1 further includes a first deep well region 11 and a second deep well region 12 which are formed in the epitaxial layer 5 and connected with the interlayer dielectric layer 6, a first shallow well region 13 formed in the first deep well region 11, a second shallow well region 14 formed in the second deep well region 12, two first source region 15 formed in the first deep well region 11, two second source region 16 formed in the second deep well region 12, a first gate oxide layer 17, which is formed in the interlayer dielectric layer 6 and connected with the epitaxial layer 5, the first deep well region 11 and the second deep well region 12, and a first polysilicon gate 18, which is formed in the interlayer dielectric layer 6 and covers the first gate oxide layer 17. The two first source region 15 are symmetric relative to the first shallow well region 13 and are connected with the first shallow well region 13, the two second source region 16 are symmetric relative to the second shallow well region 14 and are connected with the second shallow well region 14. As shown in FIG. 3, the second cell 2 includes a third deep well region 21 and a fourth deep well region 22 which are formed in the epitaxial layer 5 and connected with the interlayer dielectric layer 6, a third shallow well region 23 formed in the third deep well region 21, a fourth shallow well region 24 formed in the fourth deep well region 22, a second gate oxide layer 25 formed in the interlayer dielectric layer 6 and covering the third deep well region 21, a third gate oxide layer 26 formed in the interlayer dielectric layer 6 and covering the fourth deep well region 22, a second polysilicon gate 27 formed in the interlayer dielectric layer 6 and covering the second gate oxide layer 25, and a third polysilicon gate 28 formed in the interlayer dielectric layer 6 and covering the third gate oxide layer 26. The source electrode layer 7 includes a first settling part 71 in ohmic contact with the first shallow well region 13 and the two first source region 15, a second settling part 72 in ohmic contact with the second shallow well region 14 and the two second source region 16, a third settling part 73 in ohmic contact with the third shallow well region 23, a fourth settling part 74 in Schottky contact with the third deep well region 21, the fourth deep well region 22 and the epitaxial layer 5, and a fifth settling part 75 in ohmic contact with the fourth shallow well region 24. An interval between the third deep well region 21 and the fourth deep well region 22 is smaller than an interval between the first deep well region 11 and the second deep well region 12. In some embodiments, the interval between the third deep well region 21 and the fourth deep well region 22 is 1.0-3.0 μm.

According to the silicon carbide metal oxide semiconductor field effect transistor 100 (also called transistor 100) provided by some embodiments, source regions included in the second cell 2 are saved, which is equivalent to that continuous source regions in the art known to inventors are improved into discontinuous source regions, so that the channel density of the silicon carbide metal oxide semiconductor field effect transistor 100 can be reduced without changing its size, the short-circuit current density is reduced, the short-circuit tolerance is improved, and the effect of prolonging the short-circuit time is archived. In the transistor 100, Schottky contact is formed on the epitaxial layer between the third deep well region 21 and the fourth deep well region 22, meanwhile, the interval between the third deep well region 21 and the fourth deep well region 22 with Schottky contact is smaller than that between the first deep well region 11 and the second deep well region 12 without Schottky contact, which is equivalent to integrating a Schottky diode on the basis of the art known to inventors, the shielding effect of the third deep well region 21 and the fourth deep well region 22 on the electric field at the Schottky contact under reverse bias conditions is enhanced, which can reduce the reverse leakage current of a Schottky diode while reducing the forward voltage drop of a body diode. Therefore, with the silicon carbide metal oxide semiconductor field effect transistor 100, the problems of high short-circuit current density, low short-circuit tolerance, short short-circuit time, high forward voltage drop of a body diode, are solved, and meanwhile, the transistor 100 is simple in structure, easy to assemble, safe and reliable to use, and convenient to implement for applications.

In some embodiments, both the source electrode layer 7 and the drain electrode layer 3 are prepared by materials including aluminum, titanium and nickel through magnetron sputtering or evaporation process, or both the source electrode layer 7 and the drain electrode layer 3 are prepared by materials including aluminum, titanium and silver through magnetron sputtering or evaporation process, or both the source electrode layer 7 and the drain electrode layer 3 are prepared by materials including aluminum, titanium, nickel and silver through magnetron sputtering or evaporation process. Meanwhile, ohmic contact is formed by aluminum and titanium, or ohmic contact is formed by aluminum and nickel, or ohmic contact is formed by aluminum, titanium and nickel. Schottky contact is formed by titanium, molybdenum, tungsten and nickel, or Schottky contact is formed by titanium, molybdenum, tungsten and platinum, or Schottky contact is formed by titanium, molybdenum, tungsten, nickel and platinum. And the thickness of a flat part, for connecting the first settling part 71, the second settling part 72, the third settling part 73, the fourth settling part 74 and the fifth settling part 75, of the source electrode layer 7 is 2-5 μm. The thickness, for ohmic contact with the first shallow well region 13 and the two first source region 15, of the first settling part 71, the thickness, for ohmic contact with the second shallow well region 14 and the two second source region 16, of the second settling part 72, the thickness, for ohmic contact with the third shallow well region 23, of the third settling part 73, the thickness, for ohmic contact with the fourth shallow well region 24, of the fifth settling part 75, and the thickness, for ohmic contact with the substrate layer 4, of the source electrode layer 3 are all 10-500 nm. The thickness, for Schottky contact with the third deep well region 21, the fourth deep well region 22 and the epitaxial layer 5, of the fourth settling part 74, is 10-500 nm. In some embodiments, the materials of the source electrode layer 7 and the drain electrode layer 3 are both aluminum titanium nickel silver laminate metal low cost and good in performance.

In some embodiments, the substrate layer 4, the epitaxial layer 5, the two first source region 15 and the two second source region 16 are all formed by an N-type silicon carbide semiconductor material, and the first deep well region 11, the second deep well region 12, the third deep well region 21 and the fourth deep well region 22 as well as the first shallow well region 13, the second shallow well region 14, the third shallow well region 23 and the fourth shallow well region 24 are all formed by a P-type silicon carbide semiconductor material. The silicon carbide metal oxide semiconductor field effect transistor 100 have advantages of high voltage resistance, high temperature resistance, low operating loss, high-frequency switching and the like due to use of a silicon carbide semiconductor material having large stop band width, high breakdown field strength, high saturated electron drift speed, and high thermal conductivity.

In some embodiments, the semiconductor doping concentrations in the first deep well region 11, the second deep well region 12, the third deep well region 21 and the fourth deep well region 22 are all 5e16-5e18 $cm^{-3}$, and the thicknesses of the first deep well region 11, the second deep well region 12, the third deep well region 21 and the fourth deep well region 22 are all 0.5-3.0 μm; the semiconductor doping concentrations in the first shallow well region 13, the second shallow well region 14, the third shallow well region 23 and the fourth shallow well region 24 are all 1e18-1e19 $cm^{-3}$, and the thicknesses of the first shallow well region 13, the second shallow well region 14, the third shallow well region 23 and the fourth shallow well region 24 are all 0.5-1.5 μm; and the semiconductor doping concentrations in the two first source region 15 and the two second source region 16 are all 5e18-2e19 $cm^{-3}$, and the thicknesses of the two first source region 15 and the two second source region 16 are all 0.2-0.5 μm. The silicon carbide metal oxide semiconductor field effect transistor 100 has a better combined effect when the structures of the corresponding regions are manufactured in accordance with the above requirements.

In some embodiments, the thickness of the substrate layer 4 is 100-180 μm, and the resistivity of the substrate layer 4 is 0.01-0.03 Ωcm; and the thickness of the epitaxial layer 5 is 5-100 μm, and the doping concentration of the epitaxial layer 5 is 1e14 to 5e16 $cm^{-3}$.

In some embodiments, the material of the interlayer dielectric layer 6 is one or any combination of silicon dioxide, silicon nitride, silicon oxynitride, borophosphosilicate glass, and borosilicate glass, and the thickness of the interlayer dielectric layer 6 is 0.5-2 μm.

In addition, an ohmic contact between the first settling part and the first shallow well region is a layer between the first settling part and the first shallow well region, and an ohmic contact is formed by aluminum and titanium means a material of the first settling part is aluminum and titanium, and a thickness of the ohmic contact between the first settling part and the first shallow well region is a thickness of the layer between the first settling part and the first shallow well region. And an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all similar to the ohmic contact between the first settling part and the first shallow well region.

In addition, a Schottky contact between the fourth settling part and the third deep well region is a layer between the fourth settling part and the third deep well region, and a Schottky contact is formed by titanium, molybdenum, tungsten and nickel means a material of the fourth settling part is titanium, molybdenum, tungsten and nickel, and a thickness of the Schottky contact between the fourth settling part and the third deep well region is a thickness of the layer between the fourth settling part and the third deep well region. And a Schottky contact between the fourth settling part and the fourth deep well region, a Schottky contact between the fourth settling part and the epitaxial layer are all similar to the Schottky contact between the fourth settling part and the third deep well region.

A manufacturing method for a silicon carbide metal oxide semiconductor field effect transistor 100 provided by the disclosure includes the following steps: S1, a substrate is prepared, and an epitaxial layer 5 is prepared on the substrate; S2, a first deep well region 11, a second deep well region 12, a third deep well region 21 and a fourth deep well region 22 are prepared on the epitaxial layer 5; S3, a two first source region 15 and a two second source region 16 are prepared in the first deep well region 11 and the second deep well region 12, respectively; S4, a first shallow well region 13, a second shallow well region 14, a third shallow well region 23 and a fourth shallow well region 24 are prepared in the first deep well region 11, the second deep well region 12, the third deep well region 21 and the fourth deep well region 22, respectively; S5, a first gate oxide layer 17, a second gate oxide layer 25 and a third gate oxide layer 26, as well as a first polysilicon gate 18, a second polysilicon gate 27 and a third polysilicon gate 28 sequentially covering the first gate oxide layer 17, the second gate oxide layer 25 and the third gate oxide layer 26 are prepared on the epitaxial layer; S6, an interlayer dielectric layer 6 which is configured for burying the first gate oxide layer 17, the second gate oxide layer 25, the third gate oxide layer 26 and the first polysilicon gate 18, the second polysilicon gate 27 and the third polysilicon gate 28 is prepared on the epitaxial layer 5; S7, a source electrode layer 7 is prepared on the interlayer dielectric layer 6 and enabled to be in ohmic contact with the first shallow well region 13, the second shallow well region 14, the third shallow well region 23, the fourth shallow well region 24, the two first source region 15 and the two second source region 16, and be in Schottky contact with the third deep well region 21, the fourth deep well region 22 and the epitaxial layer 5; S8, the substrate is thinned to form a substrate layer 4; S9, an ohmic contact layer 8 is prepared on the substrate layer 4; and S10, a drain electrode layer 3 is prepared on the ohmic contact layer 8.

In conclusion, silicon carbide metal oxide semiconductor field effect transistor 100 and the manufacturing method therefor provided by the embodiments of the disclosure can solve the problems that of high short-circuit current density, low short-circuit tolerance, short short-circuit time, and high forward voltage drop of a body diode in the art known to inventors, the advantages of low short-circuit current density, high short-circuit tolerance, long short-circuit time, and the like can be ensured, and meanwhile, the reverse leakage current of a Schottky diode can be reduced while reducing the forward voltage drop of a body diode.

In addition, terms "first" and "second" are only adopted for description and should not be understood to indicate or imply relative importance or implicitly indicate the number of indicated technical features. In the description of the disclosure, 'plurality' means two or more, unless otherwise limited definitely and specifically.

In the disclosure, unless otherwise definitely specified and limited, terms "install", "mutually connect", "connect", "fix" and the like should be broadly understood. For example, the terms may refer to fixed connection and may also refer to detachable connection or integration. The terms may refer to mechanical connection and may also refer to electrical connection. The terms may refer to direct mutual connection, may also refer to indirect connection through a medium and may refer to communication in two components or an interaction relationship of the two components. For those of ordinary skill in the art, specific meanings of these terms in the disclosure can be understood according to a specific condition.

The foregoing is merely preferred embodiments of the disclosure and is not intended to limit the disclosure, and various modifications and variations of the disclosure may be available for those skilled in the art. Any modifications, equivalent replacements, improvements and the like made within the spirit and principle of the disclosure shall fall within the scope of protection of the disclosure.

What is claimed is:

1. A silicon carbide metal oxide semiconductor field effect transistor, comprising a first cell and a second cell that are disposed alternately, wherein the first cell and the second cell jointly comprises a drain electrode layer, an ohmic contact layer, a substrate layer, an epitaxial layer, an interlayer dielectric layer, and a source electrode layer which are disposed in a stacking mode, wherein the first cell further comprises: a first deep well region and a second deep well region which are formed in the epitaxial layer and connected with the interlayer dielectric layer;

a first shallow well region and a second shallow well region which are formed in the first deep well region and the second deep well region, respectively;

two first source region and two second source region which are formed in the first deep well region and the second deep well region, respectively; wherein the two first source region are symmetric relative to the first shallow well region and are connected with the first shallow well region; and the two second source region are symmetric relative to the second shallow well region and are connected with the second shallow well region;

a first gate oxide layer, which is formed in the interlayer dielectric layer and connected with the epitaxial layer, the first deep well region and the second deep well region; and a first polysilicon gate, which is also formed in the interlayer dielectric layer and covers the first gate oxide layer;

the second cell comprises: a third deep well region and a fourth deep well region which are formed in the epitaxial layer and connected with the interlayer dielectric layer;

a third shallow well region and a fourth shallow well region which are formed in the third deep well region and the fourth deep well region respectively;

a second gate oxide layer and a third gate oxide layer which are formed in the interlayer dielectric layer and cover the third deep well region and the fourth deep well region respectively; and a second polysilicon gate and a third polysilicon gate which are formed in the interlayer dielectric layer and cover the second gate oxide layer and the third gate oxide layer respectively;

wherein the source electrode layer comprises a first settling part in ohmic contact with the first shallow well region and the two first source region, a second settling part in ohmic contact with the second shallow well region and the two second source region, a third settling part in ohmic contact with the third shallow well region, a fourth settling part in Schottky contact with the third deep well region, the fourth deep well region and the epitaxial layer, and a fifth settling part in ohmic contact with the fourth shallow well region, and an interval between the third deep well region and the fourth deep well region is smaller than an interval between the first deep well region and the second deep well region.

2. The silicon carbide metal oxide semiconductor field effect transistor as claimed in claim 1, wherein the interval between the third deep well region and the fourth deep well region is 1.0-3.0 μm.

3. The silicon carbide metal oxide semiconductor field effect transistor as claimed in claim 1, wherein an ohmic contact between the first settling part and the first shallow well region, an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all formed by aluminum and titanium, and thicknesses of the ohmic contact between the first settling part and the first shallow well region, the ohmic contact between the first settling part and the two first source region, the ohmic contact between the second settling part and the second shallow well region, the ohmic contact between the second settling part and the two second source region, the ohmic contact between the third settling part and the third shallow well region, the ohmic contact between the fifth settling part and the fourth shallow well region are all 10-500 nm.

4. The silicon carbide metal oxide semiconductor field effect transistor as claimed in claim 1, wherein an ohmic contact between the first settling part and the first shallow well region, an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all formed by aluminum and nickel, and thicknesses of the ohmic contact between the first settling part and the first shallow well region, the ohmic contact between the first settling part and the two first source region, the ohmic contact between the second settling part and the second shallow well region, the ohmic contact between the second settling part and the two second source region, the ohmic contact between the third settling part and the third shallow well region, the ohmic contact between the fifth settling part and the fourth shallow well region are all 10-500 nm.

5. The silicon carbide metal oxide semiconductor field effect transistor as claimed in claim 1, wherein an ohmic contact between the first settling part and the first shallow well region, an ohmic contact between the first settling part and the two first source region, an ohmic contact between the second settling part and the second shallow well region, an ohmic contact between the second settling part and the two second source region, an ohmic contact between the third settling part and the third shallow well region, an ohmic contact between the fifth settling part and the fourth shallow well region are all formed by aluminum, titanium and nickel, and thicknesses of the ohmic contact between the first settling part and the first shallow well region, the ohmic contact between the first settling part and the two first source region, the ohmic contact between the second settling part and the second shallow well region, the ohmic contact between the second settling part and the two second source region, the ohmic contact between the third settling part and the third shallow well region, the ohmic contact between the fifth settling part and the fourth shallow well region are all 10-500 nm.

6. The silicon carbide metal oxide semiconductor field effect transistor as claimed in claim 1, wherein a Schottky contact between the fourth settling part and the third deep well region, a Schottky contact between the fourth settling part and the fourth deep well region, a Schottky contact between the fourth settling part and the epitaxial layer are all formed by titanium, molybdenum, tungsten and nickel, and thicknesses of the Schottky contact between the fourth settling part and the third deep well region, the Schottky contact between the fourth settling part and the fourth deep well region, the Schottky contact between the fourth settling part and the epitaxial layer are all 10-500 nm.

7. The silicon carbide metal oxide semiconductor field effect transistor as claimed in claim 1, wherein a Schottky contact between the fourth settling part and the third deep well region, a Schottky contact between the fourth settling part and the fourth deep well region, a Schottky contact between the fourth settling part and the epitaxial layer are all formed by titanium, molybdenum, tungsten and platinum, and thicknesses of the Schottky contact between the fourth settling part and the third deep well region, the Schottky contact between the fourth settling part and the fourth deep well region, the Schottky contact between the fourth settling part and the epitaxial layer are all 10-500 nm.

8. The silicon carbide metal oxide semiconductor field effect transistor as claimed in claim 1, wherein a Schottky contact between the fourth settling part and the third deep well region, a Schottky contact between the fourth settling part and the fourth deep well region, a Schottky contact between the fourth settling part and the epitaxial layer are all formed by titanium, molybdenum, tungsten, nickel and platinum, and thicknesses of the Schottky contact between the fourth settling part and the third deep well region, the Schottky contact between the fourth settling part and the fourth deep well region, the Schottky contact between the fourth settling part and the epitaxial layer are all 10-500 nm.

9. The silicon carbide metal oxide semiconductor field effect transistor as claimed in claim 1, wherein the substrate layer, the epitaxial layer, the two first source region and the two second source region are all formed by an N-type silicon carbide semiconductor material, and the first deep well region, the second deep well region, the third deep well region and the fourth deep well region as well as the first shallow well region, the second shallow well region, the third shallow well region and the fourth shallow well region are all formed by a P-type silicon carbide semiconductor material.

10. The silicon carbide metal oxide semiconductor field effect transistor as claimed in claim 9, wherein semiconductor doping concentrations in the first deep well region, the second deep well region, the third deep well region and the fourth deep well region are all 5e16-5e18 cm$^{-3}$, and thicknesses of the first deep well region, the second deep well region, the third deep well region and the fourth deep well region are all 0.5-3.0 μm;

semiconductor doping concentrations in the first shallow well region, the second shallow well region, the third shallow well region and the fourth shallow well region are all 1e18-1e19 cm$^{-3}$, and thicknesses of the first shallow well region, the second shallow well region, the third shallow well region and the fourth shallow well region are all 0.5-1.5 μm;

semiconductor doping concentrations in the two first source region and the two second source region are all 5e18-2e19 cm$^{-3}$, and thicknesses of the two first source region and the two second source region are all 0.2-0.5 μm.

11. The silicon carbide metal oxide semiconductor field effect transistor as claimed in claim 9, wherein a thickness of the substrate layer is 100-180 μm, and a resistivity of the substrate layer is 0.01-0.03 Ωcm;

a thickness of the epitaxial layer is 5-100 μm, and a doping concentration of the epitaxial layer is 1e14-5e16 cm$^{-3}$.

12. The silicon carbide metal oxide semiconductor field effect transistor as claimed in claim 1, wherein a material of the interlayer dielectric layer is one or any combination of silicon dioxide, silicon nitride, silicon oxynitride, borophosphosilicate glass, and borosilicate glass, and a thickness of the interlayer dielectric layer is 0.5-2 μm.

13. The silicon carbide metal oxide semiconductor field effect transistor as claimed in claim 1, wherein materials of the source electrode layer and the drain electrode layer are all aluminum, titanium, and nickel, a thickness of a flat part, for connecting the first settling part, the second settling part, the third settling part, the fourth settling part and the fifth settling part, of the source electrode layer is 2-5 μm, and a thickness of the drain electrode layer is 0.5-4 μm.

14. The silicon carbide metal oxide semiconductor field effect transistor as claimed in claim 1, wherein materials of the source electrode layer and the drain electrode layer are all aluminum, titanium and silver, a thickness of a flat part, for connecting the first settling part, the second settling part, the third settling part, the fourth settling part and the fifth settling part, of the source electrode layer is 2-5 μm, and a thickness of the drain electrode layer is 0.5-4 μm.

15. The silicon carbide metal oxide semiconductor field effect transistor as claimed in claim 1, wherein materials of the source electrode layer and the drain electrode layer are all aluminum, titanium, nickel and silver, a thickness of a flat part, for connecting the first settling part, the second settling part, the third settling part, the fourth settling part and the fifth settling part, of the source electrode layer is 2-5 μm, and a thickness of the drain electrode layer is 0.5-4 μm.

16. A manufacturing method for a silicon carbide metal oxide semiconductor field effect transistor, the silicon carbide metal oxide semiconductor field effect transistor is the silicon carbide metal oxide semiconductor field effect transistor as claimed in claim 1, wherein the manufacturing method comprises the following steps:

S1, preparing for a substrate, and preparing an epitaxial layer on the substrate;

S2, preparing a first deep well region, a second deep well region, a third deep well region and a fourth deep well region on the epitaxial layer;

S3, preparing two first source region and two second source region in the first deep well region and the second deep well region, respectively;

S4, preparing a first shallow well region, a second shallow well region, a third shallow well region and a fourth shallow well region in the first deep well region, the second deep well region, the third deep well region and the fourth deep well region, respectively;

S5, preparing a first gate oxide layer, a second gate oxide layer and a third gate oxide layer as well as a first polysilicon gate, a second polysilicon gate and a third polysilicon gate sequentially covering the first gate oxide layer, the second gate oxide layer and the third gate oxide layer on the epitaxial layer;

S6, preparing an interlayer dielectric layer which is configured for burying the first gate oxide layer, the second gate oxide layer, the third gate oxide layer and the first polysilicon gate, the second polysilicon gate and the third polysilicon gate on the epitaxial layer;

S7, preparing a source electrode layer on the interlayer dielectric layer and enabling the source electrode layer to be in ohmic contact with the first shallow well region, the second shallow well region, the third shallow well region, the fourth shallow well region, the two first source region and the two second source region, and be in Schottky contact with the third deep well region, the fourth deep well region and the epitaxial layer;

S8, thinning the substrate to form a substrate layer;

S9, preparing an ohmic contact layer on the substrate layer;

S10, preparing a drain electrode layer on the ohmic contact layer.

17. The silicon carbide metal oxide semiconductor field effect transistor as claimed in claim 2, wherein the substrate layer, the epitaxial layer, the two first source region and the two second source region are all formed by an N-type silicon carbide semiconductor material, and the first deep well region, the second deep well region, the third deep well region and the fourth deep well region as well as the first shallow well region, the second shallow well region, the third shallow well region and the fourth shallow well region are all formed by a P-type silicon carbide semiconductor material.

18. The silicon carbide metal oxide semiconductor field effect transistor as claimed in claim 3, wherein the substrate layer, the epitaxial layer, the two first source region and the two second source region are all formed by an N-type silicon carbide semiconductor material, and the first deep well region, the second deep well region, the third deep well region and the fourth deep well region as well as the first shallow well region, the second shallow well region, the third shallow well region and the fourth shallow well region are all formed by a P-type silicon carbide semiconductor material.

19. The silicon carbide metal oxide semiconductor field effect transistor as claimed in claim 4, wherein the substrate layer, the epitaxial layer, the two first source region and the two second source region are all formed by an N-type silicon carbide semiconductor material, and the first deep well region, the second deep well region, the third deep well region and the fourth deep well region as well as the first shallow well region, the second shallow well region, the third shallow well region and the fourth shallow well region are all formed by a P-type silicon carbide semiconductor material.

20. The silicon carbide metal oxide semiconductor field effect transistor as claimed in claim 2, wherein a material of the interlayer dielectric layer is one or any combination of silicon dioxide, silicon nitride, silicon oxynitride, borophosilicate glass, and borosilicate glass, and a thickness of the interlayer dielectric layer is 0.5-2 μm.

* * * * *